United States Patent
Markus et al.

(10) Patent No.: US 9,538,641 B2
(45) Date of Patent: Jan. 3, 2017

(54) ELASTIC CIRCUIT

(71) Applicants: David T. Markus, Irvine, CA (US); Michael C. Hayes, Irvine, CA (US)

(72) Inventors: David T. Markus, Irvine, CA (US); Michael C. Hayes, Irvine, CA (US)

(*) Notice: Subject to any disclaimer, the term of this patent is extended or adjusted under 35 U.S.C. 154(b) by 0 days.

(21) Appl. No.: 14/794,789

(22) Filed: Jul. 8, 2015

(65) Prior Publication Data

US 2016/0014889 A1    Jan. 14, 2016

Related U.S. Application Data

(60) Provisional application No. 62/022,197, filed on Jul. 8, 2014.

(51) Int. Cl.
- *H05K 1/00* (2006.01)
- *H05K 1/02* (2006.01)
- *H05K 3/10* (2006.01)

(52) U.S. Cl.
CPC ............ *H05K 1/0283* (2013.01); *H05K 1/028* (2013.01); *H05K 3/10* (2013.01); *H05K 2201/09263* (2013.01)

(58) Field of Classification Search
CPC .............. H05K 1/00; H05K 1/02; H05K 1/03; H05K 1/11; H05K 1/14; H05K 3/00; H01L 21/10; H01L 21/76; H01L 21/768
USPC ........ 174/254, 250, 255, 261, 117 F, 72 TR; 361/749, 752, 803; 29/829, 854; 438/51, 438/108, 119
See application file for complete search history.

(56) References Cited

U.S. PATENT DOCUMENTS

| | | | | |
|---|---|---|---|---|
| 5,313,679 A | * | 5/1994 | Yamaguchi | A47C 19/045 254/93 HP |
| 5,625,169 A | * | 4/1997 | Tanaka | H01P 5/187 174/250 |
| 6,355,052 B1 | * | 3/2002 | Neuss | A61B 17/0057 606/213 |
| 7,491,892 B2 | * | 2/2009 | Wagner | H05K 1/0283 174/254 |
| 8,329,493 B2 | * | 12/2012 | Mascaro | B29C 45/14639 438/108 |
| 9,018,532 B2 | * | 4/2015 | Wesselmann | H05K 1/0283 174/117 F |
| 9,040,337 B2 | * | 5/2015 | Park | H05K 1/0283 438/108 |
| 9,247,637 B2 | * | 1/2016 | Hsu | H05K 1/0271 |
| 9,289,132 B2 | * | 3/2016 | Ghaffari | A61B 1/00082 |
| 2002/0047012 A1 | * | 4/2002 | Colford | B65D 47/00 220/229 |
| 2004/0229508 A1 | * | 11/2004 | Miyazaki | H01R 9/0521 439/607.01 |
| 2004/0238819 A1 | * | 12/2004 | Maghribi | A61N 1/0551 257/57 |
| 2004/0243204 A1 | * | 12/2004 | Maghribi | A61N 1/05 607/115 |

(Continued)

*Primary Examiner* — Xiaoliang Chen
(74) *Attorney, Agent, or Firm* — Kafantaris Law Offices; Theo Kafantaris

(57) ABSTRACT

The present invention is an elastic electronic circuit adapted to provide three-dimensional elasticity. This is accomplished through a first pattern, a second pattern embedded within the first pattern, and a third pattern. The three-dimension elastic electronic circuit is adapted to conform to a flexible substrate, such as flexible plastic substrates and the like. The resulting three-dimensional elasticity enables the use of electronic circuits on such flexible substrates.

20 Claims, 7 Drawing Sheets

(56) References Cited

U.S. PATENT DOCUMENTS

| | | | |
|---|---|---|---|
| 2005/0127677 A1* | 6/2005 | Luttrull | H02N 2/18 290/1 R |
| 2005/0237725 A1* | 10/2005 | Cho | H01R 35/02 361/752 |
| 2008/0205019 A1* | 8/2008 | Sato | H05K 3/361 361/803 |
| 2008/0257586 A1* | 10/2008 | Chen | H01L 23/49816 174/254 |
| 2009/0317639 A1* | 12/2009 | Axisa | B32B 37/185 428/411.1 |
| 2010/0330338 A1* | 12/2010 | Boyce | B29C 59/02 428/156 |
| 2011/0065319 A1* | 3/2011 | Oster | H01R 13/2414 439/586 |
| 2011/0272181 A1* | 11/2011 | Koo | H05K 1/0219 174/254 |
| 2012/0051005 A1* | 3/2012 | Vanfleteren | H01L 21/565 361/749 |
| 2012/0314382 A1* | 12/2012 | Wesselmann | H05K 1/0283 361/749 |
| 2014/0097944 A1* | 4/2014 | Fastert | G06K 19/027 340/10.51 |
| 2014/0134840 A1* | 5/2014 | Koo | H01L 29/78603 438/666 |
| 2014/0218872 A1* | 8/2014 | Park | H05K 1/0283 361/749 |

* cited by examiner

ELASTIC CIRCUIT

CROSS-REFERENCE TO RELATED APPLICATIONS

This application claims the benefit of U.S. Provisional Patent Application No. 62/022,197, filed on Jul. 8, 2014, and incorporated herein by reference.

STATEMENT REGARDING FEDERALLY SPONSORED RESEARCH AND DEVELOPMENT

Not Applicable.

FIELD OF THE INVENTION

This invention relates generally to an elastic circuit, and more particularly, to an electronic elastic circuit adapted to stretch and contract within three dimensions.

DISCUSSION OF RELATED ART

Stretchable electronics can generally be described as electronic circuits adapted to stretch in one or two dimensions. Stretchable electronics are generally embedded on a stretchable medium and are adapted to stretch with the medium without losing electrical connectivity between electronic components. Currently, single wave patterns allow such circuits to stretch, where the wave will provide the slack necessary for the circuit to expand or contract.

While current stretchable electronic circuits are adapted to stretch in one or two dimensions, there is currently no stretchable electronic circuit adapted to provide three-dimensional elasticity. Therefore, there is a continued need for an elastic circuit adapted to provide three-dimensional elasticity. The present invention satisfies this need.

SUMMARY OF THE INVENTION

The present invention is an elastic electronic circuit adapted to provide three-dimensional elasticity. This is accomplished through implementing a first pattern, a second pattern embedded within the first pattern, and a third pattern onto a circuit. The three-dimension elastic electronic circuit is adapted to conform to a flexible substrate, such as flexible plastic substrates and the like. The resulting three-dimensional elasticity enables the use of electronic circuits on such flexible substrates.

In a first embodiment, the first pattern of the elastic circuit comprises a generally horseshoe-shaped pattern and provides elasticity along the x-axis. The second pattern of the elastic circuit is embedded within the first pattern and provides elasticity along the y-axis. The third pattern is applied to the surface of the elastic circuit and provides elasticity along the z-axis. The third pattern will further be adapted to conform to the surface of the flexible substrate.

These and other objectives of the present invention will become obvious to those of ordinary skill in the art after reading the following detailed description of the preferred embodiments. It is to be understood that the foregoing general description and the following detailed description are exemplary, and are intended to provide further explanation of the invention as claimed.

DETAILED DESCRIPTION OF THE PREFERRED EMBODIMENT

Figure 1:
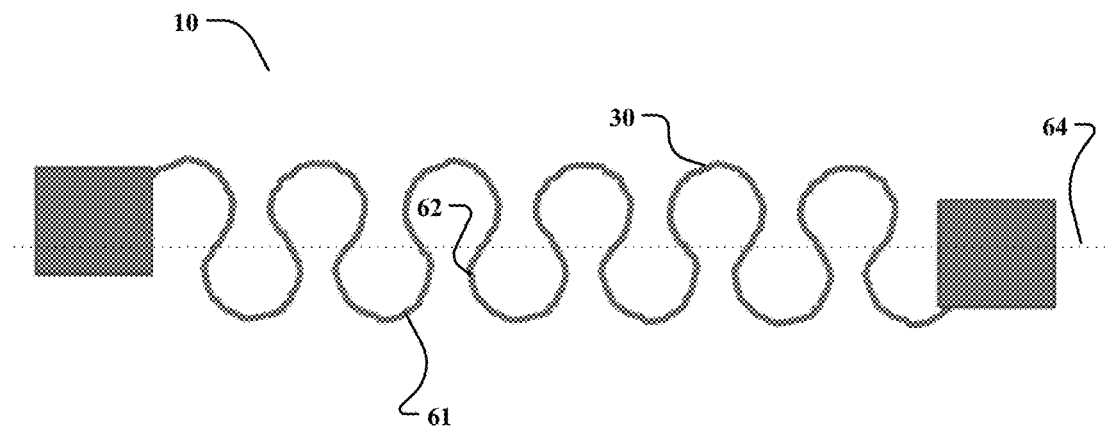
FIG. 1 is a diagram illustrating a horseshoe patterned circuit in one dimension.
Figure 2:
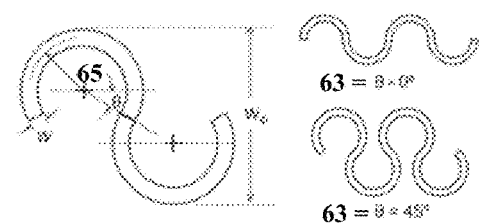
FIG. 2 is a diagram illustrating a horseshoe pattern in greater detail.
Figure 3:
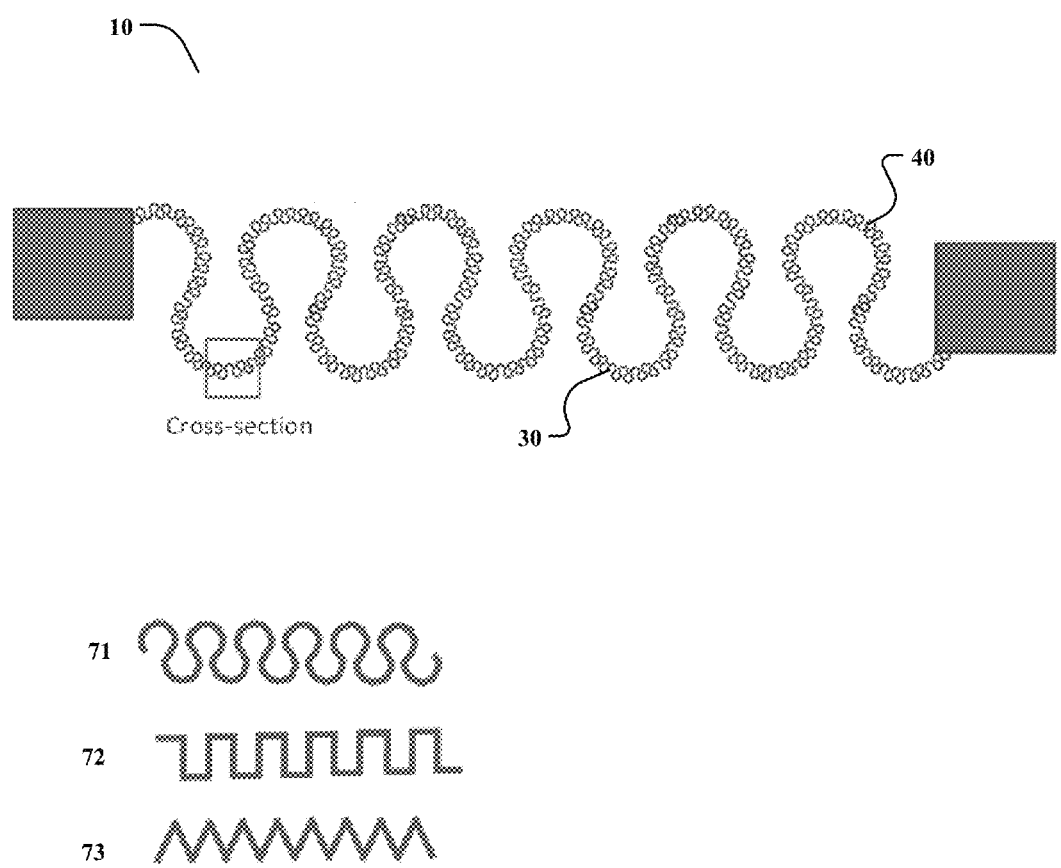
FIG. 3 is a diagram illustrating a horseshoe patterned circuit in two dimensions.
Figure 4:
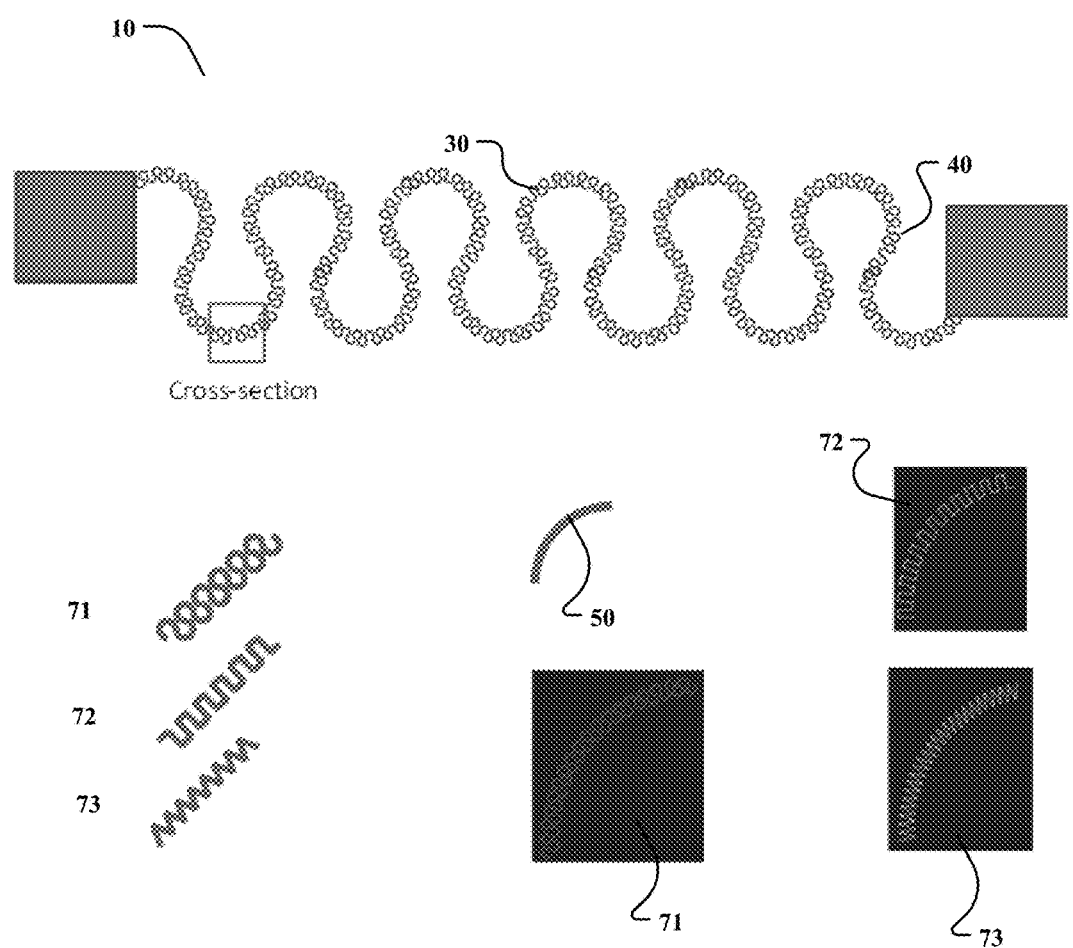
FIG. 4 is a diagram illustrating a horseshoe patterned circuit in three dimensions.

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The present invention discloses an elastic electronic circuit 10 adapted to provide three-dimensional elasticity, which can conform to a curved structure of a flexible substrate 20. The elastic circuit 10 comprises a first pattern 30, a second pattern embedded within the first pattern 40, and a third pattern 50 adapted to conform to a curved structure of a flexible substrate 20. The elastic circuit 10 is adapted to attach or be embedded within flexible polymers and/or non-flexible polymers, specifically plastic substrates, and is adapted to provide electrical connection on or within said substrates. Furthermore, the electronic circuit 10 must not negatively impact or adversely affect the intended purpose of the flexible substrate 20.

The first pattern 30 of the elastic circuit 10 is adapted to provide elasticity in a first dimension, or an X-dimension. The first pattern 30 is attached and/or embedded within flexible substrate polymer 20 and further comprises a pattern path 62, pattern width, an overall width, a radius of curvature 65, and a turning degree offset 63. In the preferred embodiment, the first pattern comprises semicircles which form a generally horseshoe pattern 61. The turning degree offset 63 will range between 30 and 60 degrees, as each partial circle will not share a center line 64. The horseshoe shaped pattern interconnects maintain their recurring shape by having different turning degrees at each connection point. In an alternative embodiment, the first pattern is a sine wave

71. In a further alternative embodiment, the first pattern is a square wave 72. In yet a further alternative embodiment, the first pattern is a triangle wave 73.

The second pattern 40 of the elastic circuit 10 is embedded within the first pattern 30 and is adapted to provide elasticity in a second dimension, or a Y-dimension. The second pattern 40 will follow the pattern path 62 of the first pattern 40, but provides a second pattern 40 within the first pattern 30. In the preferred embodiment, the second pattern 40 is identical to the first pattern 30, albeit smaller in scale. Specifically, the second pattern 40 comprises semicircles which form a generally horseshoe pattern 61. In an alternative embodiment, the second pattern 40 is a sine wave 71. In a further alternative embodiment, the second pattern 40 is a square wave 72. In yet a further alternative embodiment, the second pattern 40 is a triangle wave 73.

The third pattern 50 of the elastic circuit 10 is adapted to provide elasticity in a third dimension, or a Z-dimension. The third pattern 50 is applied to the flexible substrate polymer 20 to which the elastic circuit 10 is attached/embedded and further comprises a radius of curvature 65 and a turning degree offset 63. In the preferred embodiment, the third pattern 50 comprises semicircles which form a generally horseshoe pattern 61. The turning degree offset 63 will range between 30 and 60 degrees, as each partial circle will not share a center line 64. The horseshoe shaped interconnects maintain their recurring shape by having different turning degrees at each connection point. In an alternative embodiment, the third pattern 50 is a sine wave 71. In a further alternative embodiment, the third pattern 50 is a square wave 72. In yet a further alternative embodiment, the third pattern 50 is a triangle wave 73.

The third pattern 50 is best represented by a cross-sectional view of the elastic circuit 10. Here, the third pattern 50 can be plainly seen, with the first and second patterns 30, 40 positioned at the surface of the pattern. The third pattern 50 can be further adapted to conform to a curved structure of a curved flexible substrate 21. As such, the third pattern 50 can be adapted to not extend linearly, but rather, the third pattern 50 would follow a generally curved structure of the curved flexible substrate 21, wherein the horseshoe patterns 61 on the convex side of the curved structure 21 are generally further apart and the horseshoe patterns 61 on the concave side of the curved structure 21 are generally closer together.

Figure 5:
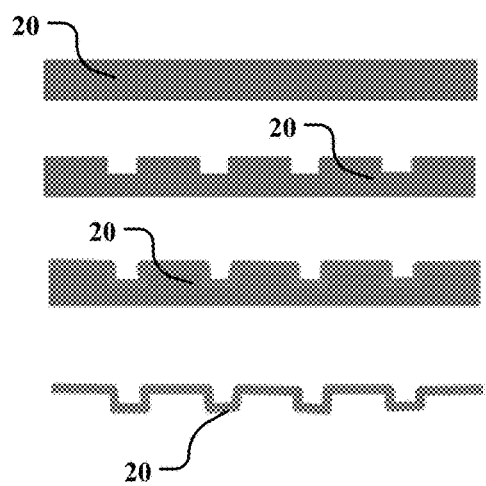
FIG. 5 is a diagram illustrating a planar mold.
Figure 6:
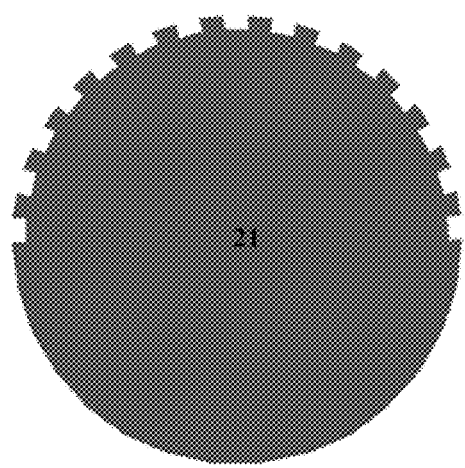
FIG. 6 is a diagram illustrating a non-planar mold.
Figures 7, 8:
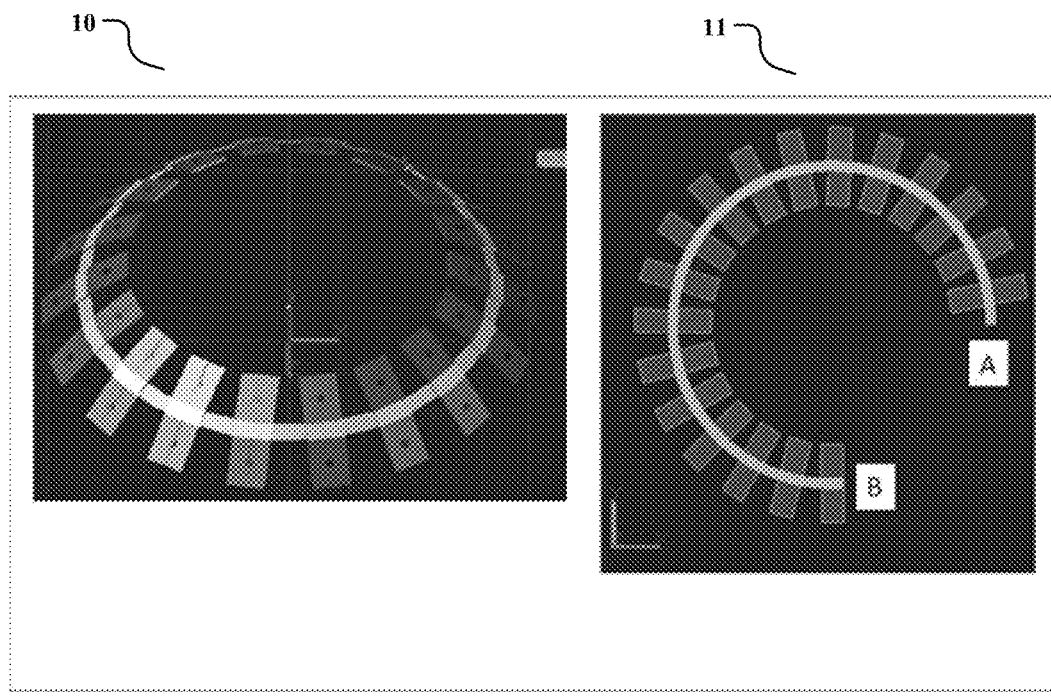
FIG. 7 is a diagram illustrating an unfolded elastic circuit.
FIG. 8 is a diagram illustrating a folded elastic circuit.

The first step when manufacturing the present invention is to create the flexible substrate 20. Here, a mold is patterned with grooves according to the third pattern 50 as shown in FIGS. 5 and 6 for planar and non-planar molds, respectively. The pattern substrate is cast onto the mold by electro spray, spin on coating, or deposited by chemical vapor deposition. The mold is chemically or mechanically removed to obtain the patterned flexible substrate 20.

Next, in order to fabricate the first and second patterns 30, 40, the patterned flexible substrate 20 is molded or etched away. For molding, a negative pattern is created on the mold, which is then filled with the substrate material and cured. The mold is then removed to obtain the patterned substrate 20. For etching, several methods can be used, including: direct laser etching, chemical etching, photodefinable etching by direct photo patterning, and plasma etching.

For laser etching, the pattern design is entered into a software laser controller program, where a laser head is controlled using gimbals head, xyz axis stages and rotation stages. No masking material is needed; the laser will etch along the border or perimeter of the pattern. For chemical etching, the pattern is transferred onto the substrate 20 using photoresist and photolithography. The substrate 20 is soaked into a chemical etchant that can selectively etch the substrate 20 and the photoresist at a different etch rate. The photoresist is rinsed off after the wet etching is complete.

For photodefinable etching by direct photo patterning, the substrate material 20 is photosensitive to UV light and a photomask or direct laser UV pattern is used to create the first and second patterns 30,40 in a photo developer. For plasma etching, the substrate 20 will have a thin coating of metal film ranging from 0.1 um to 10 um. The first and second patterns 30, 40 are transferred onto the substrate 20 using photoresist and photolithography, where the substrate 20 is soaked into a chemical enchant that can selectively etch the metal film and the photoresist at different etch rates or can use ion-milling or a reactive ion etcher for etching the metal. The substrate 20 with a metal mask is placed into the reactive ion etcher with a different gas such as oxygen or CF4 to etch away the substrate 20. The photoresist and metal mask are removed after the substrate 20 is patterned.

Figure 9:
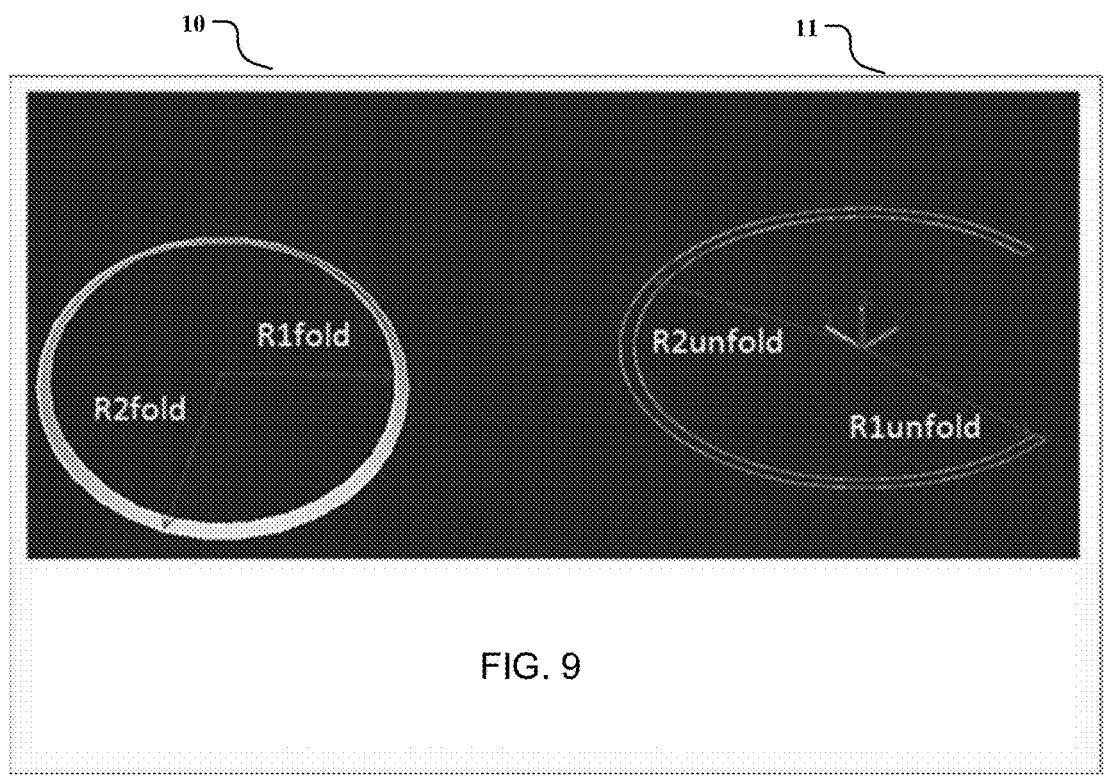
FIG. 9 is a diagram illustrating an unfolded and folded circuit with equation.
Figure 10:
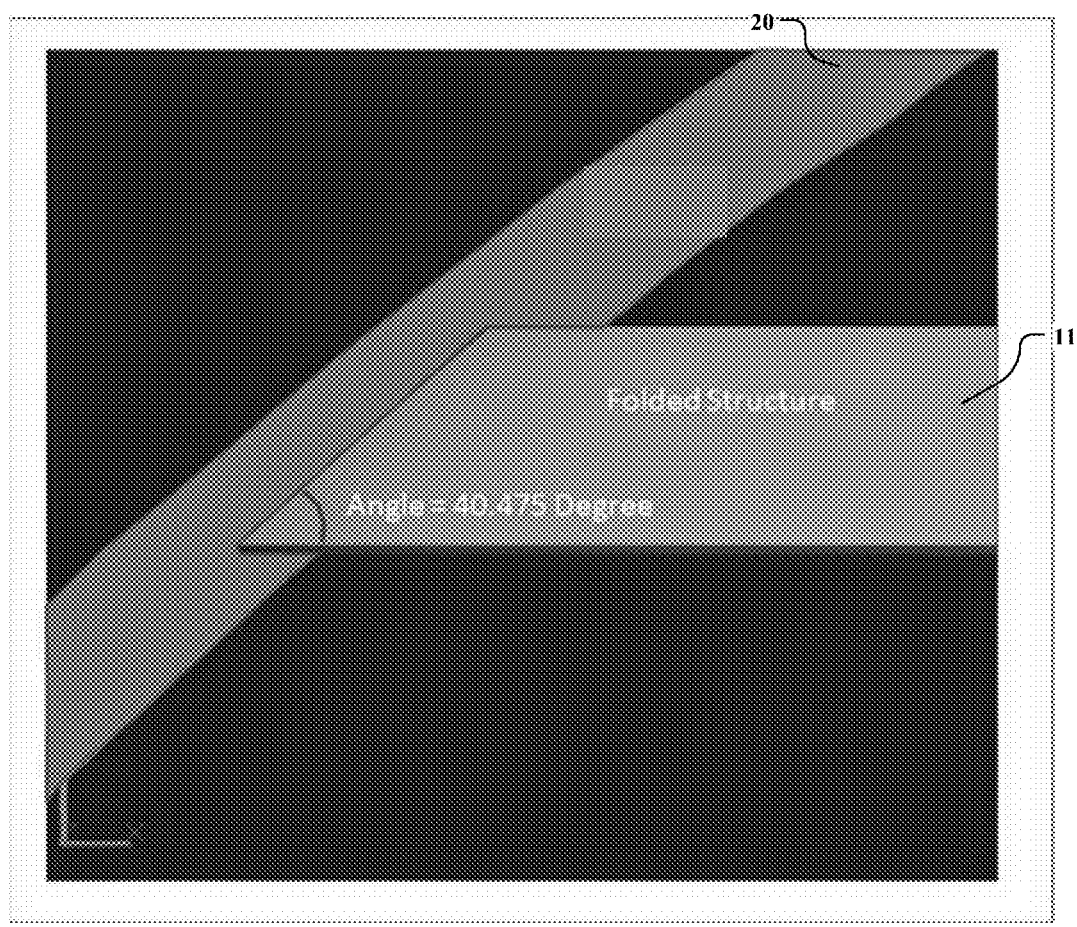
FIG. 10 is a diagram illustrating a folded structure in a flexible substrate.

Whether using molding or etching, an alternative embodiment comprises creation of an unfolded structure having end points A and B (FIG. 9). All existing semiconductors and components can be used during fabrication, and planar photolithography and/or laser cutting can further increase cost savings during manufacture. Here, the unfolded circuit 11 is mechanically joined at points A and B through soldering, epoxy, welding, or a mechanical snap (FIG. 9). The resulting structure can be convex with a layout conformal to curved surface of a flexible substrate. Generally, the radius of the unfolded structure is larger than that of the folded structure, R(unfolded)=1.312*R(folded). This is assuming the angle of the folded structure is 40.475 degrees. The circumference will remain the same.

Once the first, second, and third patterns 30, 40, 50 are created, the electronic circuit 10 can be completed. Here, the patterns operate as electrical interconnections and the electrical components are inserted between these electrical interconnections. Components include resistors, capacitors, LEDs, amplifiers, transistors, and other electronic chips. Furthermore, the first, second, and third patterns 30, 40, 50 may include first and third insulating layers and a second conductive layer.

Once the electronic circuit 10 is created, it is attached and/or embedded within a flexible substrate 20. The electronic circuit can be attached to the flexible substrate 20 using any conventional method, and can be attached to the flexible substrate 20 during an extrusion process, an injection molding process, or other molding process used to form the flexible substrate 20. The electronic circuit 10 can also be applied to the flexible substrate 20 after the flexible substrate 20 is formed, such as by using an adhesive and the like. Examples of flexible substrate 20 materials include plastics such as polypropylene and the like. Non-flexible substrate materials comprise metals, ceramics, and crystals.

While the above description contains specific details regarding certain elements, sizes, and other teachings, it is understood that embodiments of the invention or any combination of them may be practiced without these specific details. Specifically, although certain materials and shapes are designated in the above embodiments, any suitable materials or shape may be used. These details should not be construed as limitations on the scope of any embodiment, but merely as exemplifications of the presently preferred embodiments. In other instances, well known structures, elements, and techniques have not been shown to clearly explain the details of the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various the relevant art will recognize. Also, the teachings of the invention provided herein can be applied to other systems, not necessarily the system described above. The elements and acts of the various embodiments described above can be combined to provide further embodiments.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. An elastic circuit providing three-dimensional elasticity comprising:
    a first pattern attached to a flexible substrate providing elasticity on an x-axis;
    a second pattern embedded within the first pattern providing elasticity on a y-axis; and
    a third pattern applied to said flexible substrate, wherein said third pattern is represented by a cross-sectional view of said flexible substrate and provides elasticity on a z-axis;
    wherein said first, second, and third patterns provide three-dimensional elasticity to said elastic circuit.

2. The elastic circuit of claim 1, wherein said first pattern is generally horseshoe shaped and further comprises a pattern path, a radius of curvature, and a turning degree offset.

3. The elastic circuit of claim 2, wherein said turning degree offset further comprises a range between 30 and 60 degrees.

4. The elastic circuit of claim 2, wherein said second pattern is identical in shape to said first pattern.

5. The elastic circuit of claim 1, wherein said third pattern is generally horseshoe shaped and further comprises a radius of curvature and a turning degree offset.

6. The elastic circuit of claim 5, wherein said turning degree offset further comprises a range between 30 and 60 degrees.

7. The elastic circuit of claim 6, wherein a cross-sectional view of said flexible substrate will represent said third pattern.

8. The elastic circuit of claim 7, wherein said flexible substrate is curved, and wherein said third pattern is adapted to conform to said curved flexible substrate.

9. The elastic circuit of claim 8, wherein said curved flexible substrate further comprises a convex side and a concave side, wherein the horseshoe patterns on said convex side are generally further apart and the horseshoe patterns on said concave side are generally closer together.

10. The elastic circuit of claim 1, wherein said first, second, and third patterns are sine waves.

11. The elastic circuit of claim 1, wherein said first, second, and third patterns are square waves.

12. The elastic circuit of claim 1, wherein said first, second, and third patterns are triangle waves.

13. The method of manufacturing an elastic circuit, the method comprising attaching an elastic circuit onto a flexible substrate, said circuit comprising a first pattern providing elasticity on an x-axis and a second pattern embedded within said first pattern providing elasticity on a y-axis, said flexible substrate further comprising a third pattern, wherein said third pattern is represented by a cross-sectional view of said flexible substrate and provides elasticity on a z-axis, wherein said first, second, and third patterns provide three-dimensional elasticity to said elastic circuit.

14. The method of claim 13, wherein said first pattern is generally horseshoe shaped and further comprises a pattern path, a pattern width, an overall width, a radius of curvature, and a turning degree offset.

15. The method of claim 14, wherein said turning degree offset further comprises a range between 30 and 60 degrees.

16. The method of claim 14, wherein said second pattern is identical in shape to said first pattern.

17. The method of claim 13, wherein said third pattern is generally horseshoe shaped and further comprises a radius of curvature and a turning degree offset.

18. The method of claim 17, wherein said turning degree offset further comprises a range between 30 and 60 degrees.

19. The method of claim 18, wherein a cross-sectional view of said flexible substrate will represent said third pattern.

20. The method of claim 19, wherein said flexible substrate is curved, and wherein said third pattern is adapted to conform to said curved flexible substrate.

* * * * *